(12) United States Patent
Furuta et al.

(10) Patent No.: US 6,309,917 B1
(45) Date of Patent: Oct. 30, 2001

(54) THIN FILM TRANSISTOR MANUFACTURING METHOD AND THIN FILM TRANSISTOR

(75) Inventors: Mamoru Furuta; Koji Soma, both of Ishikawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/566,609

(22) Filed: May 9, 2000

(30) Foreign Application Priority Data

May 10, 1999 (JP) .................................................. 11-128121

(51) Int. Cl.⁷ .................................................. H01L 21/76
(52) U.S. Cl. .............................................. 438/149; 438/30
(58) Field of Search .................................... 438/149–165, 438/40–44, 30, 308, 910

(56) References Cited

U.S. PATENT DOCUMENTS 5,897,346 * 4/1999 Yamaguchi et al. .................. 438/162
6,010,923 * 1/2000 Jinno ..................................... 438/158

FOREIGN PATENT DOCUMENTS 9-92836   4/1997 (JP).
9-133928  5/1997 (JP).

* cited by examiner

Primary Examiner—David Nelms
Assistant Examiner—David Vu
(74) Attorney, Agent, or Firm—Ratner & Prestia

(57) ABSTRACT

A first insulation film is formed as a gate insulation film of a thin film transistor, and a gate electrode is formed on the gate insulation film. Then, dopant is implanted to form source and drain regions. A second insulation film having refractive index n1 and film thickness d2 is formed to cover the first insulation film and gate electrode as an interlayer insulation film. After forming the second insulation film, laser with wavelength $\lambda$ is applied to activate the dopant. The film thicknesses d1 and d2 of the first and second insulation films satisfy conditions against the laser wavelength $\lambda$ for forming a reflection protective film at regions where activation is necessary. At the same time, the film thicknesses d1 and d2 are set in a way that the interlayer insulation film on the gate electrode forms a reflective film. This reduces the thermal damage to the gate electrode from the laser during dopant activation.

10 Claims, 5 Drawing Sheets

THIN FILM TRANSISTOR MANUFACTURING METHOD AND THIN FILM TRANSISTOR

FIELD OF THE INVENTION

The present invention relates to the field of methods for manufacturing plycrystal silicon thin film transistors and thin film transistors as employed in liquid crystal display devices and input and output devices including image sensors.

BACKGROUND OF THE INVENTION

The electron mobility of a polycrystal silicon thin film transistor is greater by a factor of 100 than that of an amorphous silicon thin film transistor. The use of polycrystal silicon thin film transistors allows the miniaturization of elements and the denser mounting of driving circuits on one substrate. In the field of liquid crystal display devices, polycrystal silicon thin film transistors are recently used in thin film transistor arrays with built-in driving circuits. These thin film transistor arrays with built-in driving circuits have been made possible by the development of technology to manufacture arrays on glass substrates which can be easily enlarged.

To form polycrystal thin film transistors at low temperatures, the development of a method for activating the dopant implanted into the polycrystal silicon thin film at low temperatures is important as well as technology to form polycrystal silicon thin film at low temperatures. Low temperature crystallization using excimer laser annealing is often employed to form good polycrystal silicon thin films on large substrates at low temperatures.

For example, IEEE Electron Device Letters, Vol. EDL-7, No. 5, May 1986, pp. 276–278, discloses technology related to excimer laser annealing. In general, thermal annealing is used for activation, but the activation rate significantly drops as a result of reducing the processing temperature.

Rapid thermal annealing (RTA) and excimer laser activation are proposed as methods for improving the dopant activation rate at low temperatures to counteract the above disadvantage. SID97 M/52: Recent Advances in Rapid Thermal Processing of Polysilicon TFT LCDs discloses RTA activation, and the Extended Abstract of the 18th (1986) International Conference on Solid State Devices and Materials, pp. 225–228, discloses excimer laser activation.

FIGS. 3A to 3D show process flow charts describing a conventional method of manufacturing polysilicon thin film transistors for the active matrix arrays used in liquid crystal display devices. As shown in FIG. 3A, a silicon oxide film which becomes a buffer layer 12 is formed on a transparent glass substrate 11 using the plasma CVD method. Amorphous silicon (a-Si) film is then deposited using the plasma CVD method without exposing the substrate 11, on which the buffer layer 12 is formed, to air.

Next, a thermal treatment is applied to reduce the hydrogen in the a-Si film. The a-Si film is polycrystallized by excimer laser annealing to form a poly-Si film 13a. Finally, the poly-Si film 13a is processed into the size and shape required for a TFT.

Next, a silicon oxide film which becomes a gate insulation film 14 is formed. A gate electrode 15 typically made of Al alloy is formed and dopant is implanted to form a Lightly Doped Drain (LDD) region 13b in the thin film transistor as shown by an arrow 100 in FIG. 3A. As shown in FIG. 3B, a mask for implanting dopant into the source and drain regions is then formed using a photo resist 25 in a manner to cover the LDD region 13b of the thin film transistor. A large quantity of phosphorus ion, the dopant, is implanted into the source region 21 and drain region 22 by ion implantation, as shown by an arrow 100 in FIG. 3B. The source region 21 and drain region 22 which have high concentrations of dopant are called a SD region 13C.

Since the implanted dopant is electrically inactive, excimer laser light is applied, as shown by an arrow 101 in FIG. 3C, to activate it.

Then, as shown in FIG. 3D, a silicon oxide film which becomes an interlayer insulation film 16 is formed and contact holes 17a and 17b are opened on the insulation film in the source region 21 and drain region 22. A layered film of Ti and Al is formed and processed to form SD wirings 18a and 18b.

Finally, a protective insulation film 23 made of silicon nitride is formed, and annealed in a hydrogen atmosphere. Hydrogen annealing fills the empty ionic bonds in the polycrystal silicon thin film with hydrogen, enabling the characteristics of the thin film transistor to be improved.

However, the conventional method of activation using an excimer laser causes a high degree of thermal damage to the gate electrode 15. More specifically, as shown in FIG. 3C, an irradiated excimer laser light is applied to and absorbed by the polycrystal silicon through the gate insulation film 14 at the source region 21 and drain region 22 of the thin film transistor. The laser light applied to the gate electrode 15 region is also directly absorbed by the gate metal, causing the gate electrode's temperature to rise. If metals with high melting points such as W, Mo, and Cr are used for the gate electrode 15, cracks or peeling of the gate electrode 15 may occur as a result of thermal shock due to laser irradiation. If Al alloy is used for the gate electrode 15, quality problems such as an increase in hillocks may occur. Hillocks are the phenomenon whereby the material surface becomes bumpy as a result of temperature rise.

The present invention provides a thin film transistor manufacturing method and thin film transistor which reduces the thermal damage to gate electrodes caused by laser irradiation during the manufacture of thin film transistors which includes the process of dopant activation by laser irradiation.

SUMMARY OF THE INVENTION

A method for manufacturing thin film transistors in accordance with an exemplary embodiment of the present invention includes the steps of forming a semiconductor thin film on a transparent substrate; forming a first insulation film having a refractive index n1 and film thickness d1 on the semiconductor thin film as a gate insulation film; forming a gate electrode on the first insulation film; implanting dopant into the semiconductor thin film; forming a second insulation film having refractive index n2 and film thickness d2 in a way to cover the first insulation film and gate electrode; and activating dopant implanted by applying laser with wavelength λ after forming the second insulation film. In this configuration, the film thicknesses d1 and d2 practically satisfy a set of Formulae (1) and (2) as follows:

$$d2*n2 = 2*m*\lambda/4 \tag{1}$$

$$d1*n1 + d2*n2 = (2*m1-1)*\lambda/4 \tag{2}$$

Here, m and m1 are any given positive integer.

These film thicknesses enable the laser light to be reflected off the gate electrode and absorbed at portions other than the gate electrode. This allows a reduction in the thermal damage to the gate electrode by laser irradiation, and also achieves efficient dopant activation by the laser.

Another exemplary embodiment of the present invention refers to a method for manufacturing thin film transistors including the steps of forming the semiconductor film on the transparent substrate; forming the first insulation film having refractive index n1 and film thickness d1 on the semiconductor thin film as a gate insulation film; forming the gate electrode on the first insulation film; implanting dopant into the semiconductor thin film after forming the gate electrode; forming the second insulation film having refractive index n2 and film thickness d2 in a way to cover the first insulation film and gate electrode; and activating dopant implanted by laser irradiating with a wavelength λ after forming the second insulation film.

In this configuration, the film thickness d1 of the first insulation film and film thickness d2 of the second insulation film fall in a range practically satisfying a set of Formulae (5) and (6) when m and m1 are any given positive integers.

$$\text{abs}\{d2*n2-2*m*\lambda/4\}<\lambda 8 \qquad (5);$$

and $$\text{abs}\{(d2*n2+d1*n1)-(2*m1-1)*\lambda/4\}<\lambda/8 \qquad (6);$$

The above acceptable range for the film thicknesses d1 and d2 allows to reduce the thermal damage to the gate electrode by laser irradiation, and also to achieve efficient dopant activation by the laser.

In these methods for manufacturing thin film transistors, the first insulation film is silicon oxide made by decomposing a gaseous material containing at least organic silicon material by plasma.

A thin film transistor of the present invention includes a semiconductor thin film formed on a transparent substrate; a first insulation film having refractive index n1 and film thickness d1 formed on the semiconductor thin film as a gate insulation film; a gate electrode formed on the first insulation film; dopant implanted into the semiconductor thin film; and a second insulation film having refractive index n2 and film thickness d2 formed in a way to cover the first insulation film and gate electrode. Implanted dopant is activated by applying the laser with wavelength λ. In this configuration, the film thicknesses d1 and d2 practically satisfy a set of Formulae (1) and (2) when m and m1 are any given positive integers.

DESCRIPTION OF THE PREFERRED EMBODIMENT

Figure 1A:
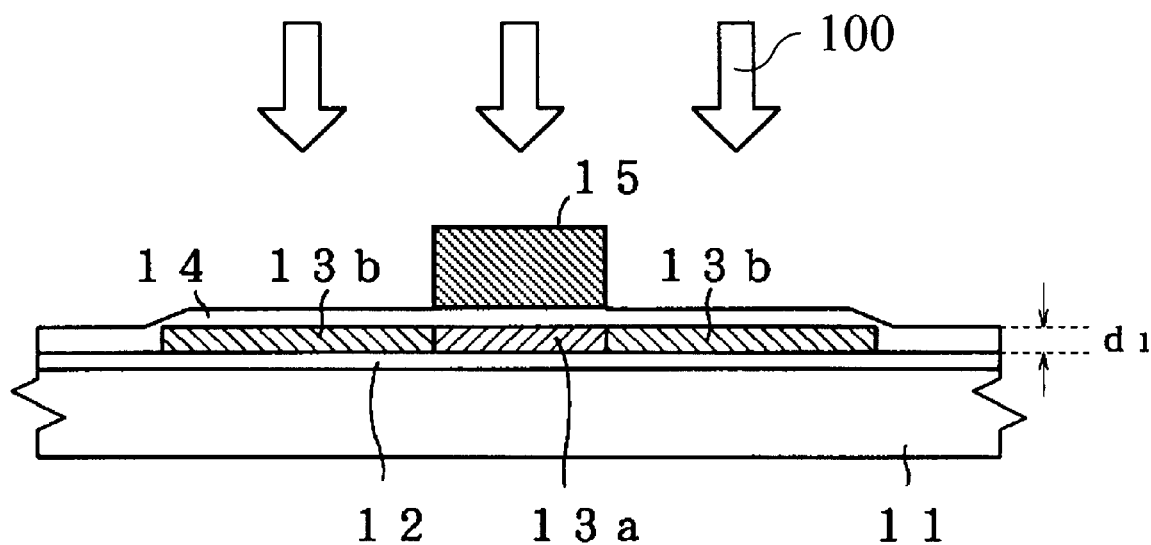
FIGS. 1A to 1D are sectional views illustrating processes of a method for manufacturing thin film transistors in a preferred embodiment of the present invention.

A method for manufacturing thin film transistors in a preferred embodiment of the present invention is described below with reference to FIGS. 1A to 1D. As shown in FIG. 1A, a silicon oxide film of 400 nm thick is formed on a transparent glass substrate 11 using the plasma CVD method to form a buffer layer 12. Then, amorphous silicon (a-Si) is deposited up to 50 nm thick using the plasma CVD method without exposing the glass substrate 11, on which the silicon oxide thin film is formed, to air. To reduce hydrogen in the a-Si film, the glass substrate 11 is thermally treated at 450° C. for 90 minutes under the reduced nitrogen atmosphere of 1 Torr. The a-Si film is polycrystalized by excimer laser annealing to form a poly-Si film 13a which is a non-single crystal semiconductor thin film. As for excimer laser, XeCl excimer laser with a wavelength of 308 nm is used, and irradiated in a vacuum. Its energy density is 350 mJ/cm², and average irradiation shots are 35 shots/point.

After crystallizing the a-Si film to form the poly-Si film 13a, the poly-Si film 13a is processed into the size and shape required for a TFT. A silicon oxide film of 50 nm thick is deposited to form a gate insulation film 14 which is a first insulation film. This silicon oxide film is made from a mixed gas of oxygen gas and TEOS (tetraethylorthosilicate, $Si(OCH_2CH_3)_4$) gas, which is an organic silicon material using the plasma CVD method. The film thickness is set to 45 nm.

Figure 1B:
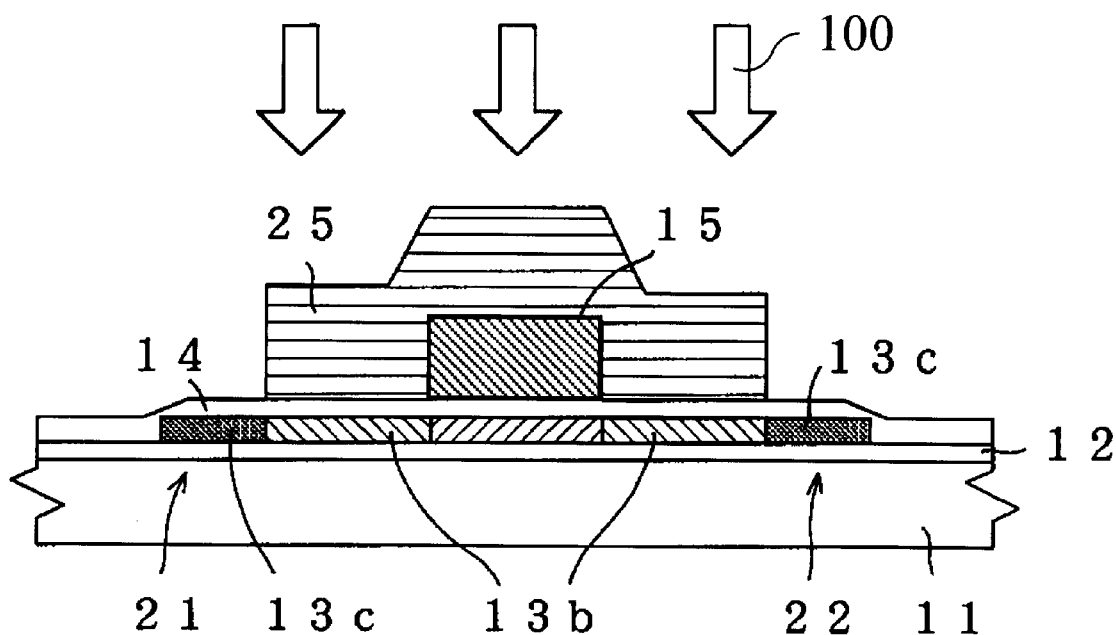

A gate electrode 15 made of Al alloy is then formed. An LDD region 13b of the thin film transistor is formed by implanting dopant using the gate electrode 15 as a mask. Phosphorus ion is excited at the accelerated voltage of 70 keV, and implanted to the direction of an arrow 100 for a dose rate of $10^{13}$/cm². After forming the LDD region 13b, photo resist 25 is applied to cover the LDD region 13b of the thin film transistor, as shown in FIG. 1B, to form a mask for implanting dopant into the source region 21 and drain region 22. The LDD region is not essential, but is effective for reducing the OFF-state current of the thin film transistor.

Figure 1C:
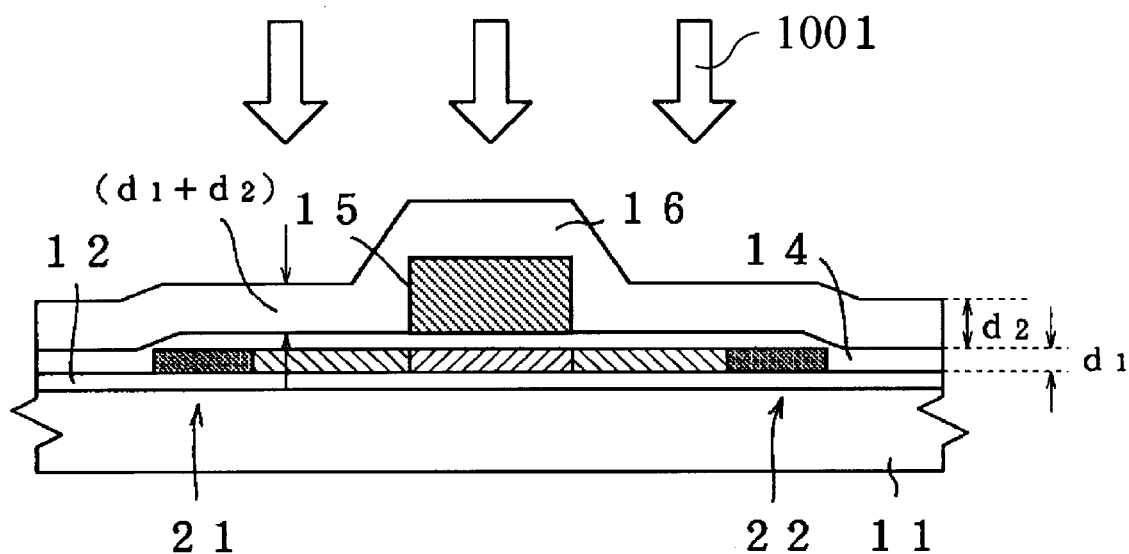
Figure 1D:
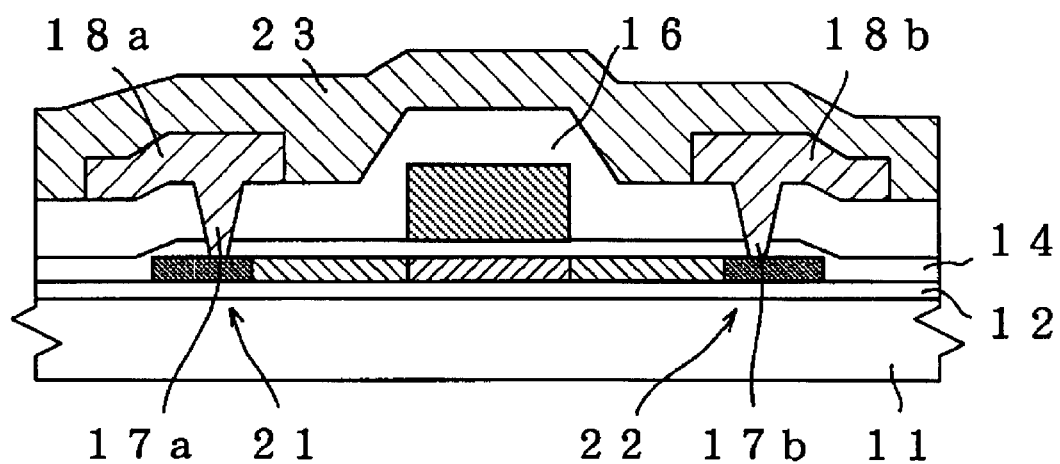

After implanting the dopant, a silicon oxide film of 215 nm thick is formed as a second insulation film, as shown in FIG. 1C, to form an interlayer insulation film 16. Then, a short-wave excimer laser is applied to activate implanted dopant as shown by an arrow 101 in FIG. 1C. The laser used for activation is XeCl excimer laser, and has a wavelength λ of 308 nm, and a half width of 30 nm. Its energy density is 300 mJ/cm², and the average irradiation shots are 20 shots/point.

The gate insulation film 14, which is the first insulation film, has the film thickness d1=50 nm and refractive index n1=1.46. The interlayer insulation film 16, which is the second insulation film, formed on the gate insulation film 14 has the film thickness d2=215 nm and refractive index n1=1.46. Accordingly, insulation film on the source region 21 and drain region 22 of the thin film transistor which requires dopant activation has a film thickness of d1+d2= 265 nm. The refractive index n1 is both 1.46.

Figure 2A:
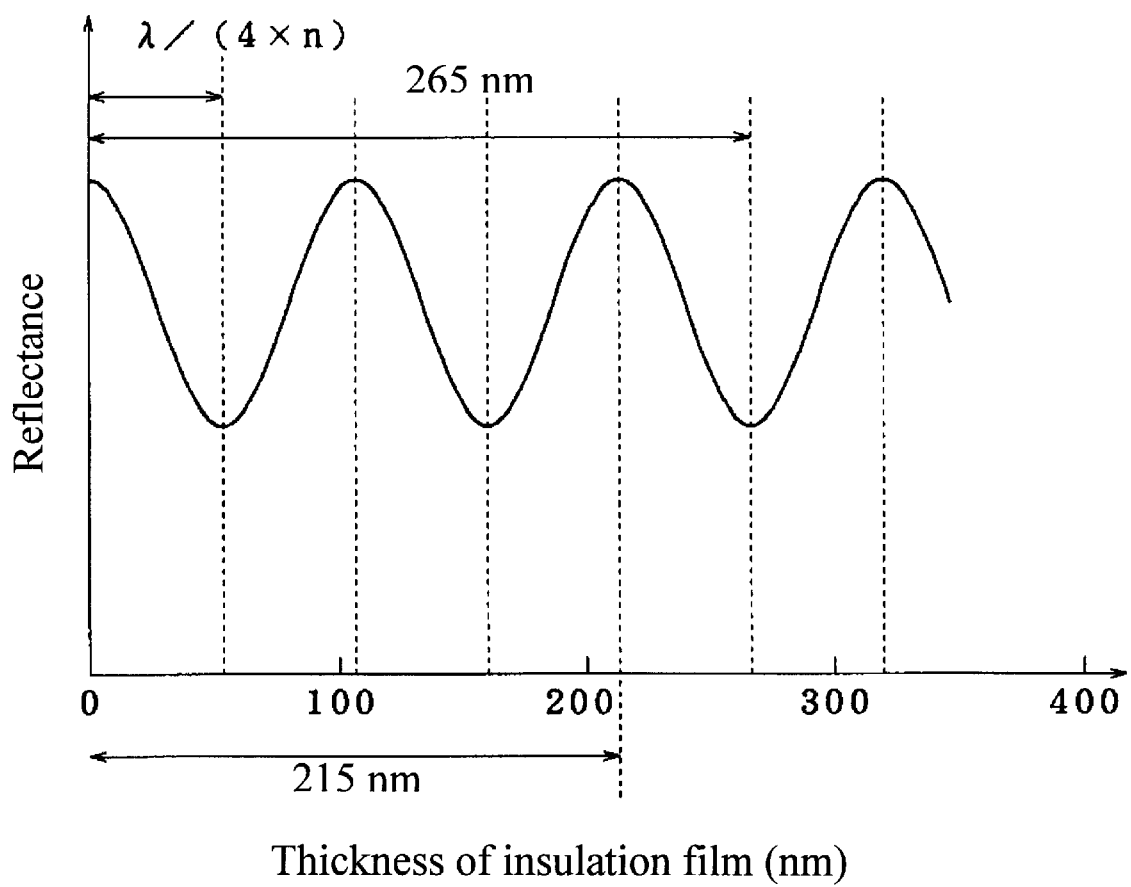
FIG. 2A shows a characteristics chart illustrating the relation between the film thickness of an insulation film and reflectance of laser light.
Figure 2B:
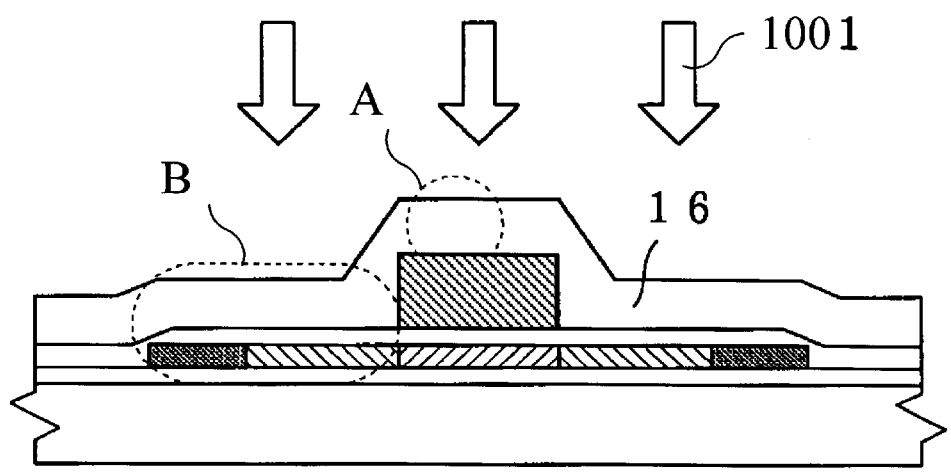
FIG. 2B is a sectional view of regions A and B in the thin film transistor.
Figure 3A:
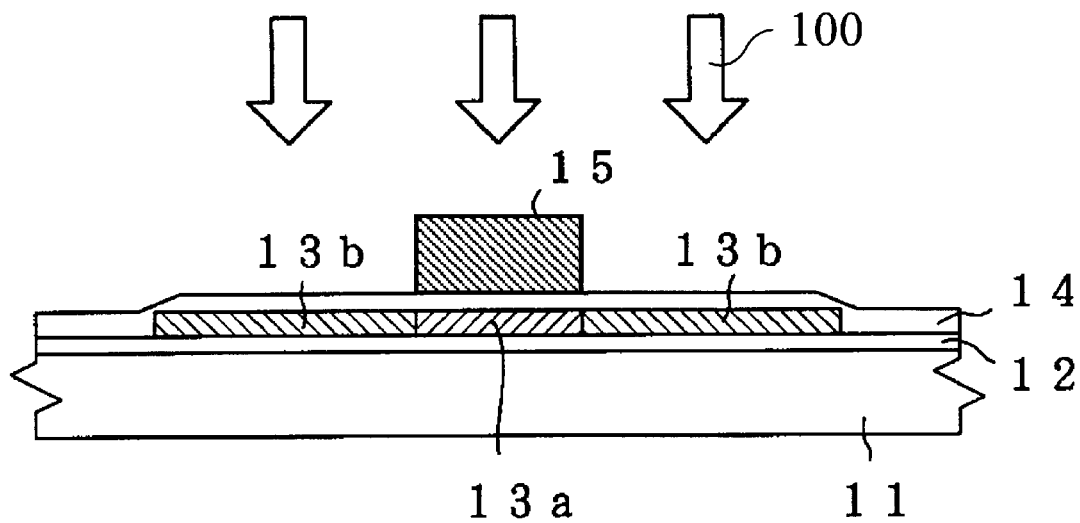
FIGS. 3A to 3D are sectional views illustrating processes of a conventional method for manufacturing thin film transistors.
Figure 3B:
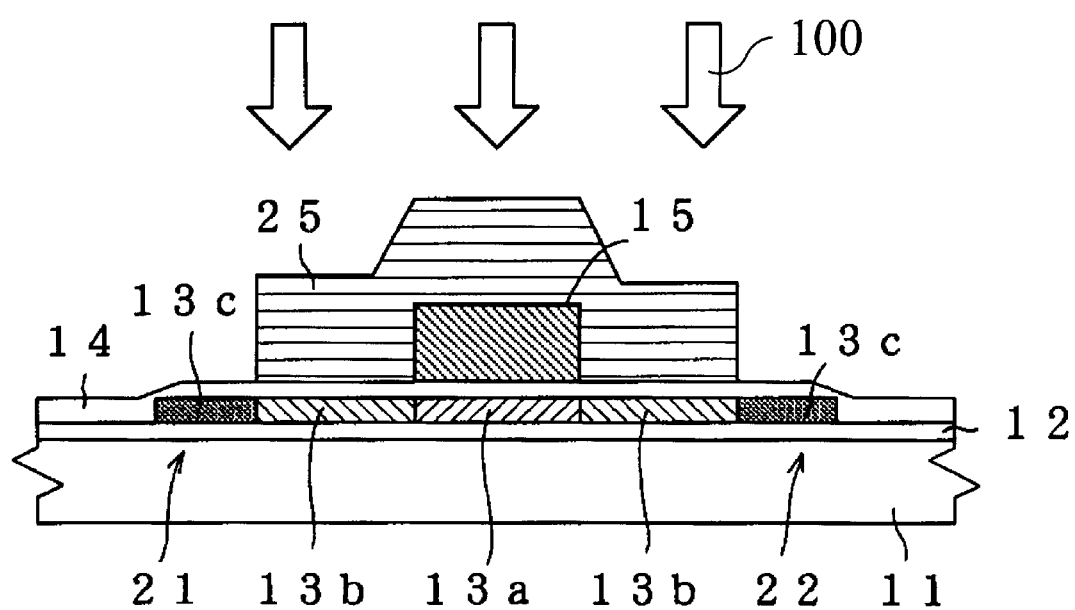
Figure 3C:
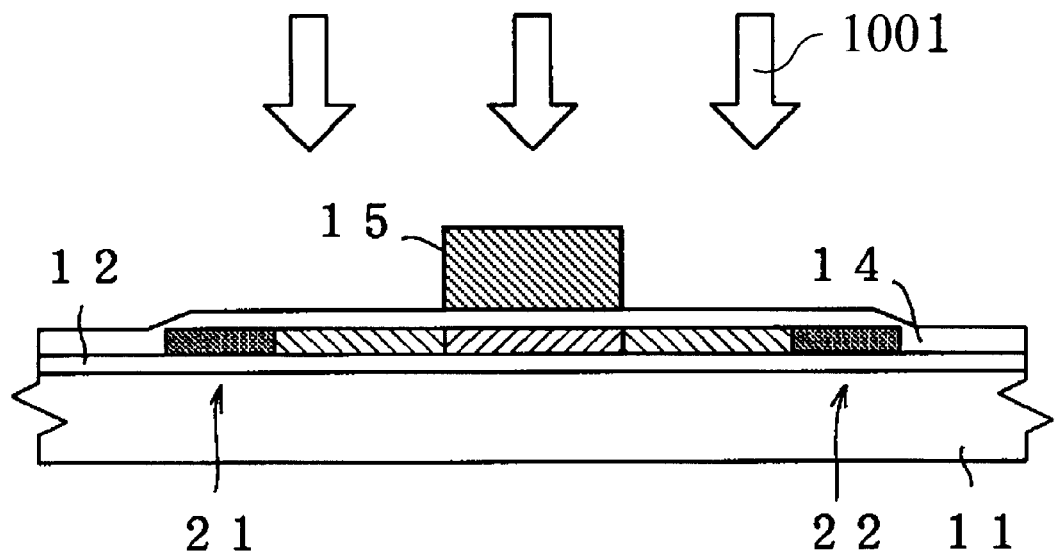
Figure 3D:
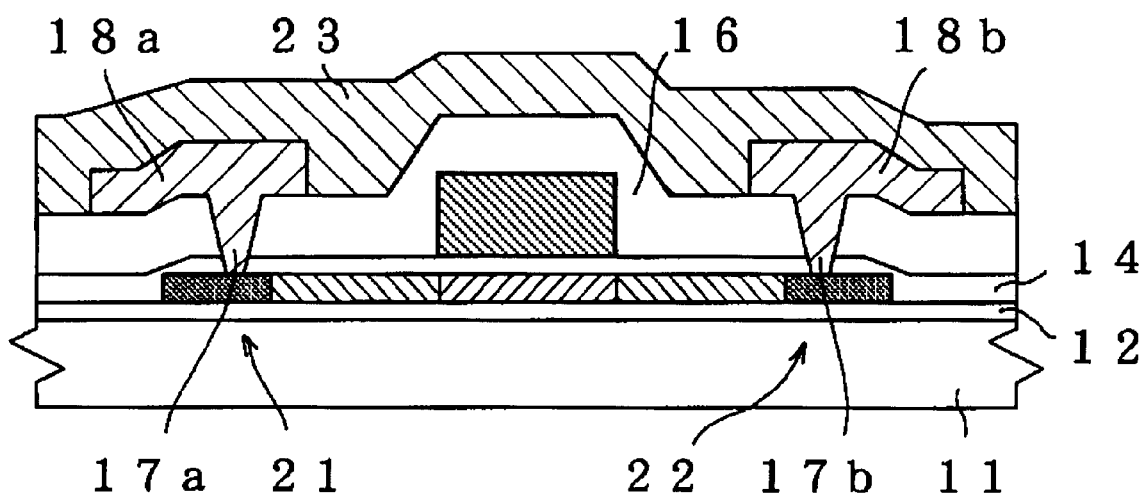

FIG. 2A shows the reflectance of laser light against the thickness of insulation film when the laser light enters the insulation film ($SiO_2$) from the air. FIG. 2B shows a sectional view of the thin film transistor during activation by the laser light. This figure corresponds to the sectional view in FIG. 1C. The reflectance of the laser light entering the insulation film from the air repeats the maximum and minimum reflectance in a cycle of λ/(4*n), as shown in FIG. 2A, when the laser wavelength is λ and refractive index of the insulation film is n.

FIG. 2A shows the case when the wavelength λ of excimer laser is 308 nm, and refractive index n of the insulation film ($SiO_2$) is 1.46. In this case, a half cycle λ/(4*n) of the reflectance is 52.7 nm. Accordingly, since laser light enters the interlayer insulation film (d2=215 nm) on the region A shown in FIG. 2B, which is the gate electrode, the reflectance becomes almost the maximum as shown in FIG. 2A, and incident laser energy is scarcely absorbed by the gate electrode 15 of the thin film transistor On the other hand, on the region B shown in FIG. 2B, which is the source region 21, drain region 22, and LDD region 13b of the thin film transistor, the laser light enters the film having the thickness of the sum of the film thickness d1=50 nm of the gate insulation film and the film thickness d2=215 nm of the interlayer insulation film i.e., d1+d2=265 nm. Accordingly, the reflectance is almost minimum as shown in FIG. 2A, and incident laser energy reaches the bottom poly-Si film 13a most efficiently. The poly-Si film 13a is thus most efficiently annealed, and dopant implanted is satisfactorily activated.

The above findings may take the next numerical forms.

Ideal conditions are achieved when the interlayer insulation film thickness d2 is an even multiple of a half period of the reflectance, i.e., $$d2 = 2*m*\lambda/(4*n1); \text{ and}$$

the sum d1+d2 of both insulation film thicknesses is an odd multiple of a half period of the reflectance, i.e., $$d1+d2 = (2*m1-1)*\lambda/(4*n1).$$

Here m and m1 are any given positive integers.
These formulae may then be rearranged as follows:

$$d2*n1 = 2*m*\lambda/4; \text{ and}$$

$$(d1+d2)*n1 = (2*m1-1)*\lambda/4.$$

These formulae may be generalized for the case when refractive index n2 of the interlayer insulation film is different from refractive index n1 of the gate insulation film as follows:

$$d2*n2 = 2*m*\lambda/4 \quad (1);$$

and $$d2*n2 + d1*n1 = (2*m1-1)*\lambda/4 \quad (2).$$

In other words, the dopant is ideally activated by the laser when a set of Formulae (1) and (2) are satisfied.

After dopant activation, contact holes 17a and 17b are opened on the interlayer insulation film 16 as shown in FIG. ID, and then SD wiring 18a and 18b made of a Ti and Al layered film are respectively formed. Lastly, a protective insulation film 23 made of silicon nitride is formed, and annealed in a hydrogen atmosphere. Accordingly, empty ionic bonds in the polycrystal silicon thin film are filled with hydrogen to improve characteristics of the thin film transistor.

Annealing in the above description is preferably conducted at between 250° C. and 400° C. for 30 minutes to 3 hours. Here, annealing temperature is 350° C.; and annealing time is 1 hour. A thin film transistor manufactured using the manufacturing method of the present invention demonstrates mobility of 150 cm²/V•sec and Vth=2.0 V. An increase in hillocks is not observed in a process of dopant activation by the laser even if Al alloy is used for the gate electrode 15.

The manufacturing method of the present invention thus enables excimer laser light to be reflected off the interlayer insulation film 16 on the gate electrode 15. On the other hand, interlayer insulation film 16 and gate insulation film 14 on the source region 21, drain region 22, and LDD region 13b of the thin film transistor prevents reflection of the excimer laser. This allows efficient absorption of laser energy at regions requiring dopant activation, and at the same time, prevents absorption of laser energy at the gate electrode which requires to avoid temperature rise. Accordingly, materials which likely to cause hillocks, cracks and the like by temperature rise, such as Al and metals having a large stress and high melting point including Cr, Mo, W, and Ni, may be used for gate wiring.

As shown in FIG. 2A, minimum and maximum reflectance repeat in every insulation film thickness of $\lambda/(4*n1)$ [nm] against wavelength λ of the laser in use and refractive index n1 of the insulation film. Accordingly, errors in the film thickness of the insulation film are preferably within the range of a half of a minimum interval where the reflectance becomes the maximum and minimum, i.e, $\pm\lambda/(8*n1)$ [nm]. If this condition is quantified, the film thickness d1 of the gate insulation film and the film thickness d2 of the interlayer insulation film may satisfy a set of the following Formulae (3) and (4) when m and m1 are any given positive integers:

$$\text{abs}\{d2*n1 - 2*m*\lambda/4\} < \lambda/8 \quad (3);$$

and $$\text{abs}\{(d2+d1)*n1 - (2*m1-1)*\lambda/4\} < \lambda/8 \quad (4).$$

The preferred embodiment uses the same material for the gate insulation film and interlayer insulation film, which means the same refractive index n1 for both films. However, there is no need to use materials having the same refractive index. When materials having different refractive index are used for the gate insulation film and interlayer insulation film, the film thicknesses d1 and d2 may satisfy a set of the following Formulae (5) and (6) when m and m1 are any given positive integers:

$$\text{abs}\{d2*n2 - 2*m*\lambda/4\} < \lambda/8 \quad (5);$$

and $$\text{abs}\{(d2*n2 + d1*n1) - (2*m1-1)*\lambda/4\} < \lambda/8 \quad (6);$$

where film thickness of the gate insulation film is d1 and its refractive index is n1, and film thickness of the interlayer insulation film is d2 and its refractive index is n2.

The same effects as described in the preferred embodiment are achievable when the above Formulae (5) and (6) are satisfied.

The use of organic silicon material, such as TEOS gas decomposed by plasma for making the gate insulation film, as described in the preferred embodiment, is effective for improving the reliability of the thin film transistor because a damage to the base layer at depositing the film is little.

As described above, the present invention enables formation of an optical reflective film on the gate electrode against the laser light, and formation of a reflection preventive film on the source and drain regions of the thin film transistor when the laser light is applied to activate the dopant. This enables the gate electrode to reflect the laser beam during activation, and at the same time, allows the regions where dopant is implanted to absorb energy efficiently. Accordingly, cracks and peeling of the gate electrode is preventable even in laser annealing conditions achieving sufficient activation rate. As a result, the present invention significantly improves the yield in the manufacturing of thin film transistors.

Furthermore, the use of silicon oxide film made by decomposing an organic silicon material by plasma for covering the source region and the drain region of the thin film transistor by an insulation film enables further improvement in the reliability of the thin film transistor.

What is claimed is:

1. A method of manufacturing a thin film transistor, said method comprising:

forming a semiconductor thin film on a transparent substrate;

forming a first insulation film having refractive index n1 and film thickness d1 on said semiconductor thin film;

forming a gate electrode on said first insulation film;

implanting dopant into said semiconductor thin film;

forming a second insulation film having refractive index n2 and film thickness d2 in a way to cover said first insulation film and said gate electrode; and activating said implanted dopant by applying a laser with wavelength λ;

wherein said film thicknesses d1 and d2 are of sufficient thickness to cause said laser to be reflected off of the gate electrode and to be absorbed by said thin film transistor away from said gate electrode, and wherein said thickness d1 and d2 satisfy a set of the Formulae (1) and (2) when m and m1 are any given positive integers:

$$d2*n2 = 2*m*\lambda/4 \quad (1);$$

and $$d1*n1 + d2*n2 = (2*m1-1)*\lambda/4 \quad (2).$$

2. The method of manufacturing a thin film transistor according to claim 1, wherein said first insulation film is a gate insulation film.

3. A method of manufacturing a thin film transistor, said method comprising:

forming a semiconductor thin film on a transparent substrate;

forming a first insulation film having refractive index n1 and film thickness d1 on said semiconductor thin film;

forming a gate electrode on said first insulation film;

implanting dopant into said semiconductor thin film;

forming a second insulation film having refractive index n2 and film thickness d2 in a way to cover said first insulation film and said gate electrode; and activating said implanted dopant by applying a laser with wavelength λ;

wherein said film thicknesses d1 and d2 are of sufficient thickness to cause said laser to be reflected off of the gate electrode and to be absorbed by said thin film transistor away from said gate electrode, and wherein said thickness d1 and d2 fall in a range satisfying a set of the Formulae (5) and (6) when m and m1 are any given positive integers:

$$abs\{d2*n2 - 2*m*\lambda/4\} < \lambda/8 \quad (5);$$

and $$abs\{(d2*n2 + d1*n1) - (2*m1-1)*\lambda/4\} < \lambda/8 \quad (6).$$

4. The method for manufacturing a thin film transistor as defined in claim 3, wherein the refractive index n2 of said second insulation film is substantially equal to the refractive index n1 of said first insulation film.

5. The method for manufacturing a thin film transistor as defined in claim 1, wherein said first insulation film is silicon oxide made by decomposing a gaseous material at least containing organic silicon by plasma.

6. The method for manufacturing a thin film transistor as defined in claim 3, wherein said first insulation film is silicon oxide made by decomposing a gaseous material at least containing organic silicon by plasma.

7. The method for manufacturing a thin film transistor as defined in claim 1, wherein said semiconductor thin film is non-single crystal semiconductor thin film made of polycrystal silicon.

8. The method for manufacturing a thin film transistor as defined in claim 3, wherein said semiconductor thin film is non-single crystal semiconductor thin film made of polycrystal silicon.

9. The method for manufacturing a thin film transistor as defined in claim 1, wherein dopant for forming source and drain regions of said thin film transistor, and dopant for forming a lightly doped drain (LDD) are implanted in said step of implanting dopant into said semiconductor thin film.

10. The method for manufacturing a thin film transistor as defined in claim 3, wherein dopant for forming source and drain regions of said thin film transistor, and dopant for forming a lightly doped drain (LDD) are implanted in said step of implanting dopant into said semiconductor thin film.

* * * * *